United States Patent [19]
Ozeki et al.

[11] Patent Number: 5,414,672
[45] Date of Patent: May 9, 1995

[54] SEMICONDUCTOR MEMORY DEVICE INCLUDING ADDRESS TRANSITION DETECTOR

[75] Inventors: Yuko Ozeki; Yoshio Fudeyasu, both of Hyogo, Japan

[73] Assignee: Mitsubishi Denki Kabushiki Kaisha, Tokyo, Japan

[21] Appl. No.: 126,763

[22] Filed: Sep. 27, 1993

[30] Foreign Application Priority Data

Oct. 7, 1992 [JP] Japan .................................. 4-268745

[51] Int. Cl.[6] .............................................. G11C 7/00
[52] U.S. Cl. .................... 365/233.5; 365/191; 365/233
[58] Field of Search .............. 365/194, 195, 201, 191, 365/233, 233.5

[56] References Cited

U.S. PATENT DOCUMENTS

| | | | |
|---|---|---|---|
| 5,214,610 | 5/1993 | Houston | 365/233.5 |
| 5,243,575 | 9/1993 | Sambandan et al. | 365/233.5 |
| 5,301,165 | 11/1994 | Ciraula et al. | 365/233.5 |
| 5,305,283 | 4/1994 | Shimokura et al. | 365/233.5 |
| 5,307,324 | 4/1994 | Nishimoto | 365/233.5 |
| 5,335,206 | 8/1994 | Kawamoto | 365/233.5 |

FOREIGN PATENT DOCUMENTS 3-205685  9/1991  Japan.

OTHER PUBLICATIONS

"A 1Mb CMOS DRAM with Fast Page and Static Column Modes", by Shozo Saito et al, Digest of Technical Papers, 1985 IEEE, pp. 252–253.

Primary Examiner—Joseph A. Popek
Assistant Examiner—Son Mai
Attorney, Agent, or Firm—Lowe, Price, LeBlanc & Becker

[57] ABSTRACT

A dynamic random access memory (DRAM) includes an improved column system enable circuit. The circuit provides a column system enable signal /CE in response to an externally applied timing control signal Stc. An ATD detects transition of an address signal after being activated in response to the signal /CE. Since an activation timing of ATD can be determined by an external signal, it is possible to test easily an address transition detecting operation immediately after activation of ATD. Therefore, it is possible to shorten time required for the test.

8 Claims, 9 Drawing Sheets

SEMICONDUCTOR MEMORY DEVICE INCLUDING ADDRESS TRANSITION DETECTOR

BACKGROUND OF THE INVENTION

1. Field of the Invention

The present invention relates generally to semiconductor memory devices, and more particularly, to an improvement in a semiconductor memory device including an address transition detector. The present invention has particular applicability to dynamic random access memories (DRAMs).

2. Description of the Background Art

Semiconductor memories such as a dynamic random access memory (hereinafter referred to as a "DRAM"), and a static random access memory (hereinafter referred to as an "SRAM") and the like have been conventionally used in various electronic apparatuses. In general, various tests are conducted to semiconductor memories before shipping at factory. As for the DRAM and the SRAM, various tests are also conducted before shipping. As integration density of these semiconductor memories is increased, time required for the tests tends to be increased. Therefore, an improvement for shortening the time required for the tests is needed.

An address transition detector (hereinafter referred to as an "ATD") is used in various semiconductor memories such as a DRAM, an SRAM and the like, or semiconductor devices. The ATD detects transition of an externally applied address signal to generate a pulse signal (generally referred to as an "ATD pulse"). A semiconductor memory includes various circuits initiating operations in response to the ATD pulse.

Although the present invention can be applied to semiconductor memories including the ATD in general, an example where the present invention is applied to a DRAM will be described hereinafter.

Figure 5:
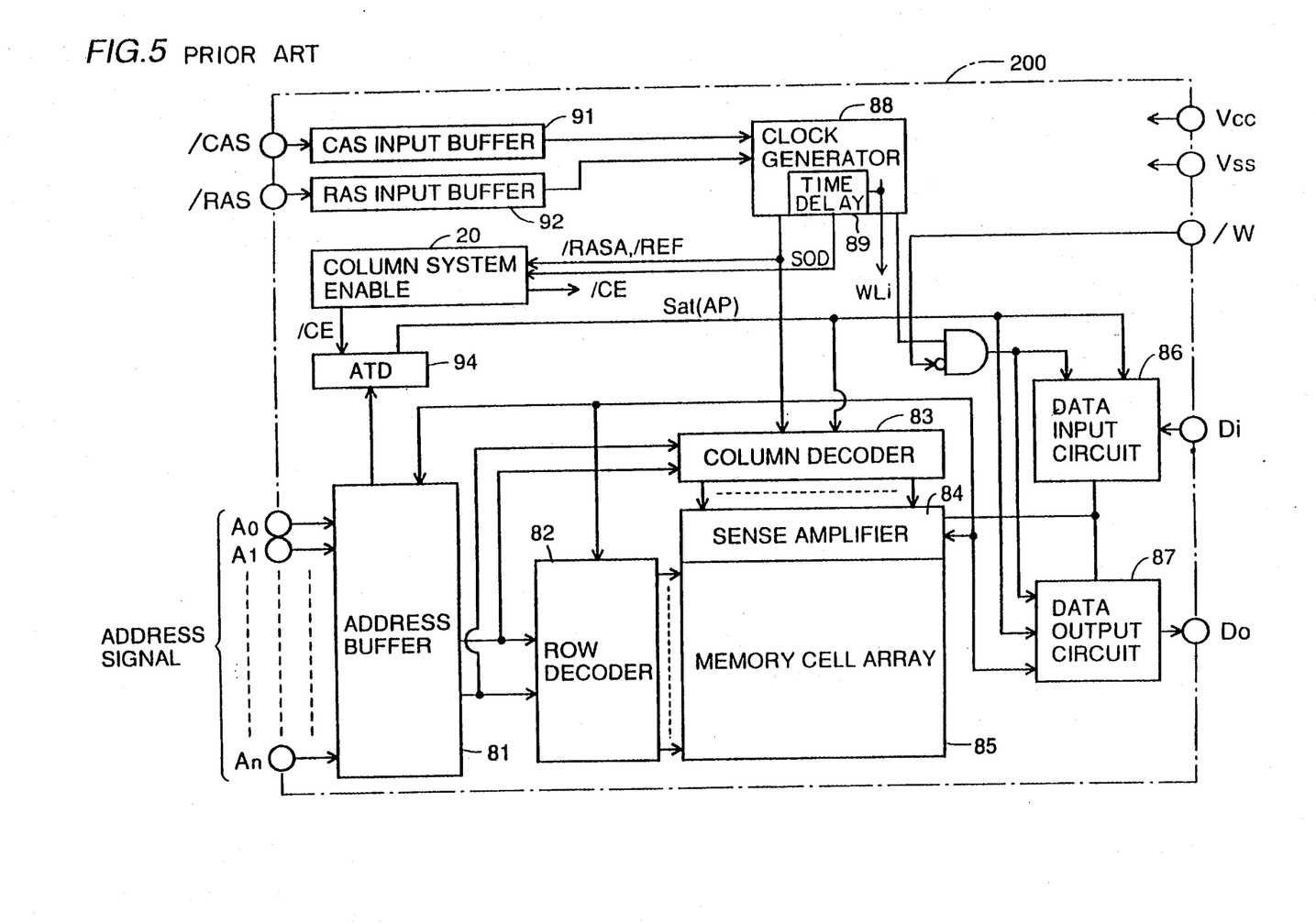
FIG. 5 is a block diagram of a DRAM showing the background of the present invention.

FIG. 5 is a block diagram of a DRAM showing the background of the present invention. Referring to FIG. 5, a DRAM 200 includes a memory cell array 85 including a number of memory cells, an address buffer 81 receiving externally applied address signals A0–An, a row decoder 82 and a column decoder 83 for designating rows and columns, respectively, of memory cell array 85 in response to received address signals, and a sense amplifier 84 for amplifying a data signal read out from the memory cell. Input data Di is applied through a data input circuit 86. Output data Do is provided through a data output circuit 87.

A row address strobe signal /RAS is applied to a clock generator 88 through a RAS input buffer 92. A column address strobe signal /CAS is applied to clock generator 88 through a CAS input buffer 91. Clock generator 88 generates clock signals for controlling various circuits provided in DRAM 200.

Figure 9:
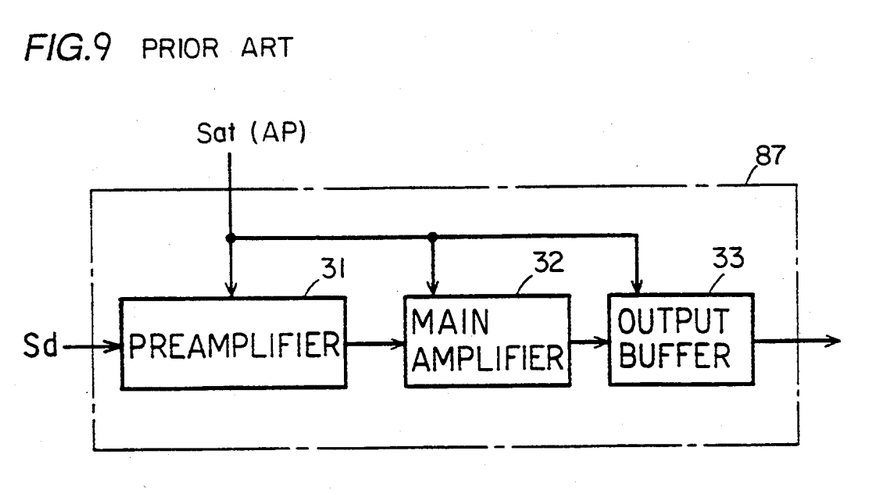
FIG. 9 is a schematic diagram of a data output circuit shown in FIG. 5.

DRAM 200 further includes a column system enable circuit 20 for enabling column system circuits in DRAM 200, and an ATD 94 for generating an address transition detect signal Sat in response to a column system enable signal /CE. Column decoder 83, data input circuit 86, data output circuit 87 and the like are included as column system circuits. A preamplifier 31, a main amplifier 32 and an output buffer 33 shown in FIG. 9 are included in data output circuit 87.

Column system enable circuit 20 receives clock signals /RASA, /REF and SOD applied from clock generator 88. The internal row address strobe signal /RASA is synchronized with the externally applied signal /RAS. The internal refresh signal /REF is generated from a refresh mode determining circuit (not shown) provided in clock generator 88. When the signal /REF is in a low level, DRAM 200 operates in a CAS before RAS refresh cycle. The signal SOD indicates completion of a sense operation by sense amplifier 84. The signal SOD is generated by a time delay circuit 89 in clock generator 88 by delaying an activation timing of a word line activating signal for a word line WLi provided in memory cell array 85.

Column system enable circuit 20 provides the column system enable signal /CE of a low level in response to the signal /RASA of a low level and the signals /REF and SOD of a high level, and provides the signal /CE of a high level otherwise. ATD 94 is activated in response to the signal /CE of a low level. After being activated, ATD 94 detects transition of address signals A0 to An applied through address buffer 81 to generate the address transition detect signal Sat. More specifically, ATD 94 detects transition from a row address signal to a column address signal to generate the signal Sat including an ATD pulse.

Column decoder 83, data input circuit 86 and data output circuit 87 are activated in response to the address transition detect signal Sat. In particular, data output circuit 87 includes a preamplifier, a main amplifier and an output buffer, these circuits of which are activated in response to the signal Sat.

FIG. 9 is a schematic diagram of data output circuit 87 shown in FIG. 5. Referring to FIG. 9, data output circuit 87 includes preamplifier 31 receiving a data signal Sd amplified by sense amplifier 84, main amplifier 32 connected to the output of preamplifier 31, and output buffer 33 connected to the output of main amplifier 32. Output data Do is provided through output buffer 33. Preamplifier 31, main amplifier 32 and output buffer 33 are activated in response to an ATD pulse AP included in the output signal Sat from ATD 94 shown in FIG. 5.

Figure 6:
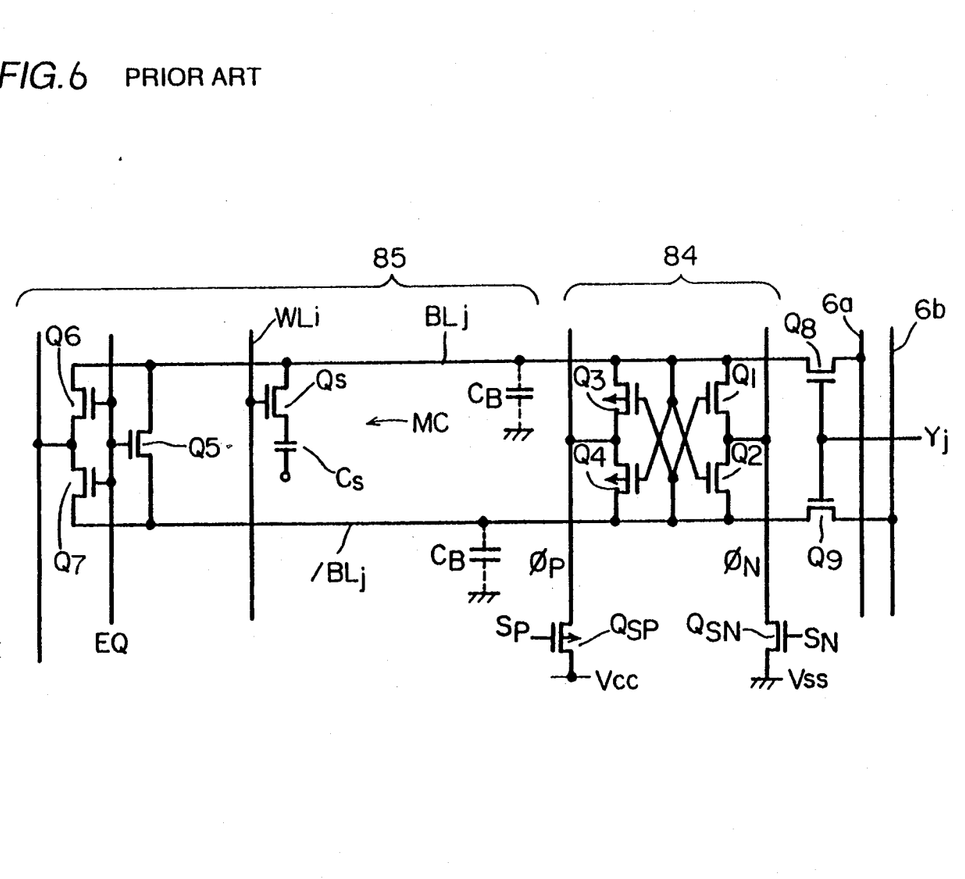
FIG. 6 is a schematic diagram of a conventional bit line peripheral circuit.
Figure 7:
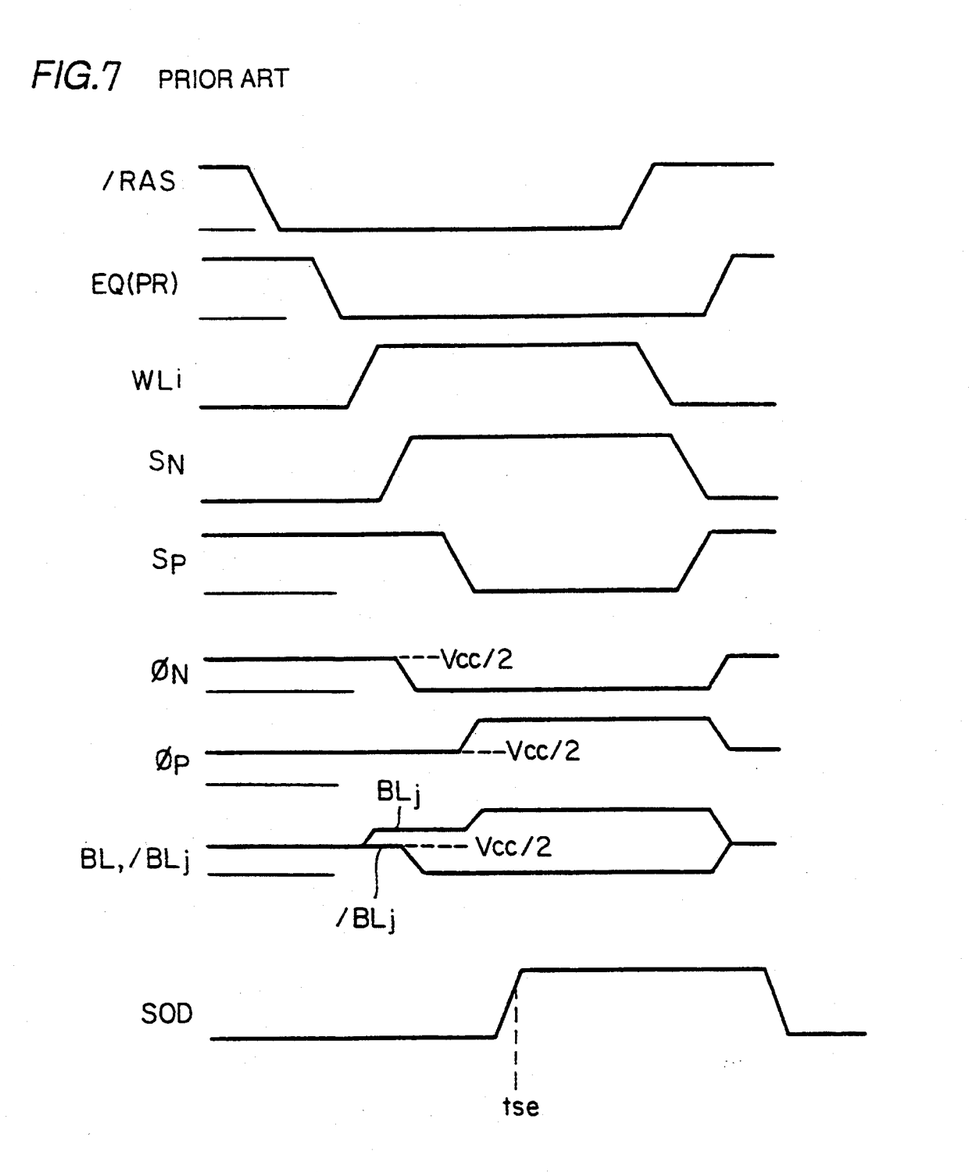
FIG. 7 is a timing chart for explaining operations of the circuit shown in FIG. 6.

FIG. 6 is a schematic diagram of a circuit showing a portion of a conventional bit line peripheral circuit. The circuit shown in FIG. 6 is provided in sense amplifier 84 and memory cell array 85 shown in FIG. 5. FIG. 7 is a timing chart for explaining operations of the circuit shown in FIG. 6. Description on the bit line peripheral circuit shown in FIG. 6 is given on pages 252 and 253 of *Digest of Technical Papers* of International Solid-State Circuits Conference held in 1985 (ISSCC 85).

Referring to FIGS. 6 and 7, in the reading operation, when a word line WLi is activated (in other words, when the potential of the word line WLi attains a high level), a switching transistor Qs of a memory cell MC is turned on. Therefore, a data signal stored in a capacitor Cs in the memory cell MC appears on a bit line BLj. Since a sense amplifier 5 configured of transistors Q1 to Q4 is activated in response to activation control signals $S_P$ and $S_N$, a small potential difference appearing between bit lines BLj and /BLj is amplified. Since a column select signal Yj of a high level is applied to the gates of transistors Q8 and Q9 from column decoder 83, transistors Q8 and Q9 are turned on. Therefore, the data signal amplified by sense amplifier 84 is applied to an IO line pair 6a, 6b. The data signal on IO line pair 6a, 6b is transmitted to data output circuit 87. In FIG. 7, the termination signal SOD is shown.

Figure 3:
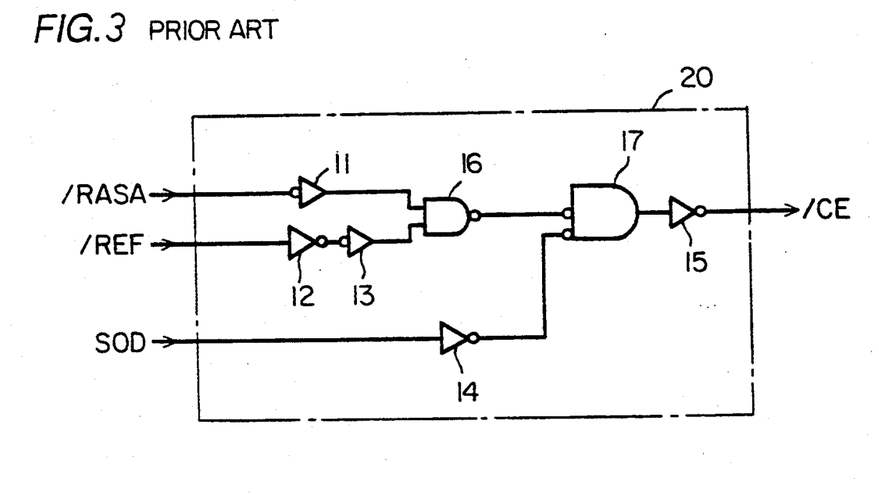
FIG. 3 is a schematic diagram of the column system enable circuit shown in FIG. 5.

FIG. 3 is a schematic diagram of column system enable circuit 20 shown in FIG. 5. Referring to FIG. 3, column system enable circuit 20 includes inverters 11 to 15, a NAND gate 16, and a NOR gate 17. The signal /RASA is applied to NAND gate 16 through inverter 11. The signal /REF is applied to NAND gate 16 through inverters 12 and 13. The signal SOD is applied to NOR gate 17 through inverter 14. NOR gate 17 also receives an output signal of NAND gate 16. An output signal of NOR gate 17 is provided as the column system enable signal /CE after being inverted by inverter 15.

In operation, column system enable circuit 20 provides the signal /CE of a low level when the signal /RASA of a low level and the signals /REF and SOD of a high level are applied, and it provides the signal /CE of a high level otherwise.

Figure 8:
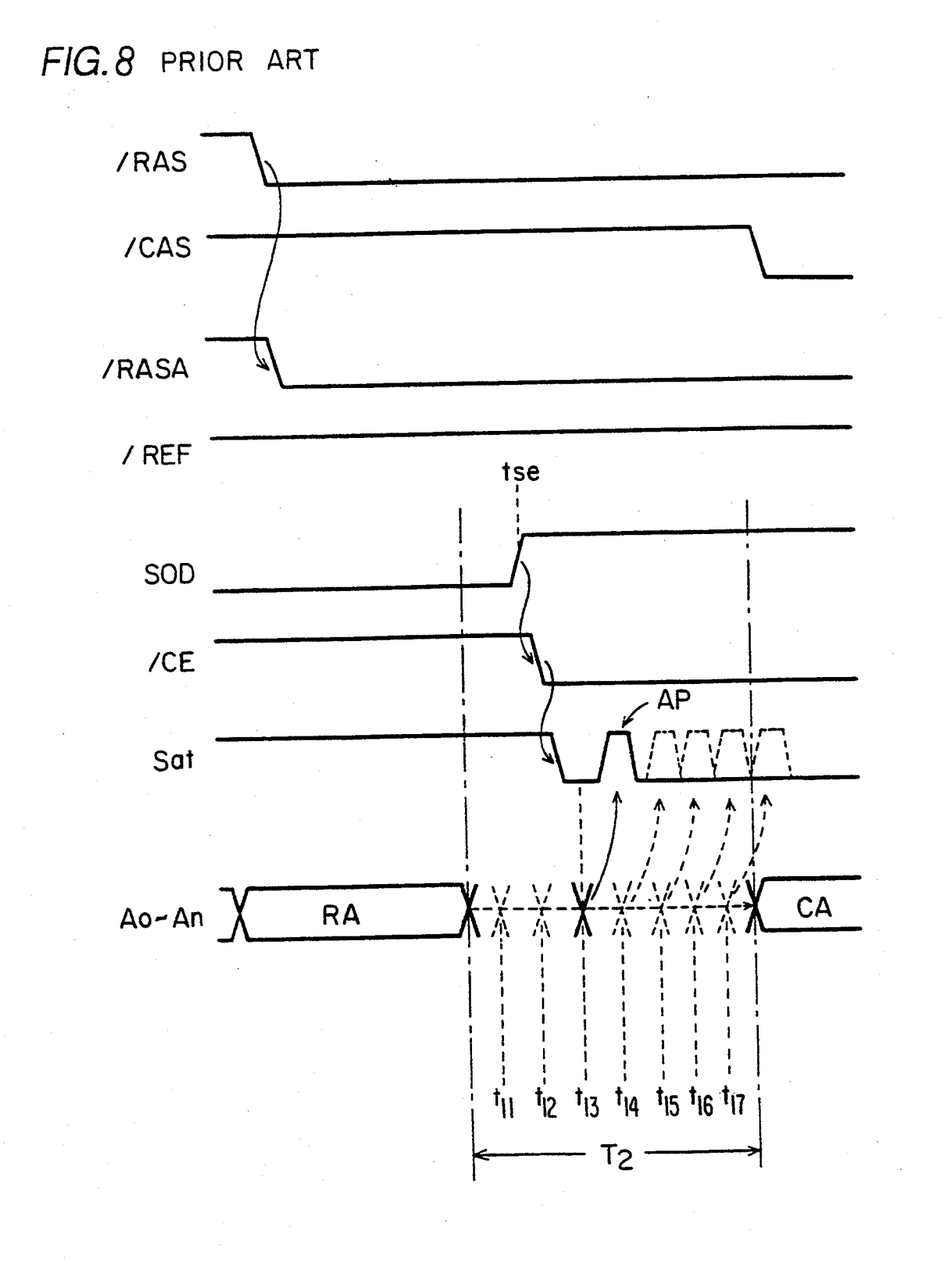
FIG. 8 is a timing chart for explaining operations of the circuit shown in FIG. 3.

FIG. 8 is a timing chart for explaining operations of column system enable circuit 20 shown in FIG. 3. Referring to FIGS. 3 and 8, operations of column system enable circuit 20 will now be described.

In response to the fall of the externally applied signal /RAS, the internal signal /RASA falls. In response to the fall of the signal /RAS, externally applied address signals A0 to An are held by address buffer 81 as row address signal RA. The row address signal RA is applied to row decoder 82. At this time, column system enable circuit 20 provides the signal /CE of a high level.

At a time tse, the termination signal SOD rises. The rise of the signal SOD shows termination of the sense operation by sense amplifier 84. More specifically, as shown in FIG. 7, the termination signal SOD rises a predetermined time after the word line signal WLi rises and sense amplifier 84 is activated (see FIG. 7). For example, the termination signal SOD is generated approximately at time tse by delaying the word line signal WLi.

In column system enable circuit 20 shown in FIG. 3, NAND gate 16 applies an output signal of a low level to NOR gate 17 in response to the signal /RASA of a low level and the signal /REF of a high level. Since a signal of a high level is applied to NOR gate 17 before the rise of the sense termination signal SOD, NOR gate 17 provides a signal of a low level. Therefore, the column system enable signal /CE of a high level is provided through inverter 15.

Since a signal of a low level is applied to NOR gate 17 after the rise of the termination signal SOD, NOR gate 17 provides a signal of a high level. Therefore, the column system enable signal /CE of a low level is provided through inverter 15.

Referring to FIG. 8, at the time tse, the termination signal SOD rises. In response to the rise of the signal SOD, column system enable circuit 20 provides the column system enable signal /CE of a low level. The output signal Sat of ATD 94 changes to a low level after ATD 94 is activated. After being activated, ATD 94 generates the ATD pulse AP (shown by a dashed line of FIG. 8) in response to transition of address signals A0 to An, that is, transition from the row address signal RA to the column address signal CA. Column decoder 83, data input circuit 86 and data output circuit 87 shown in FIG. 5 are activated in response to the ATD pulse AP included in the signal Sat.

Figure 10:
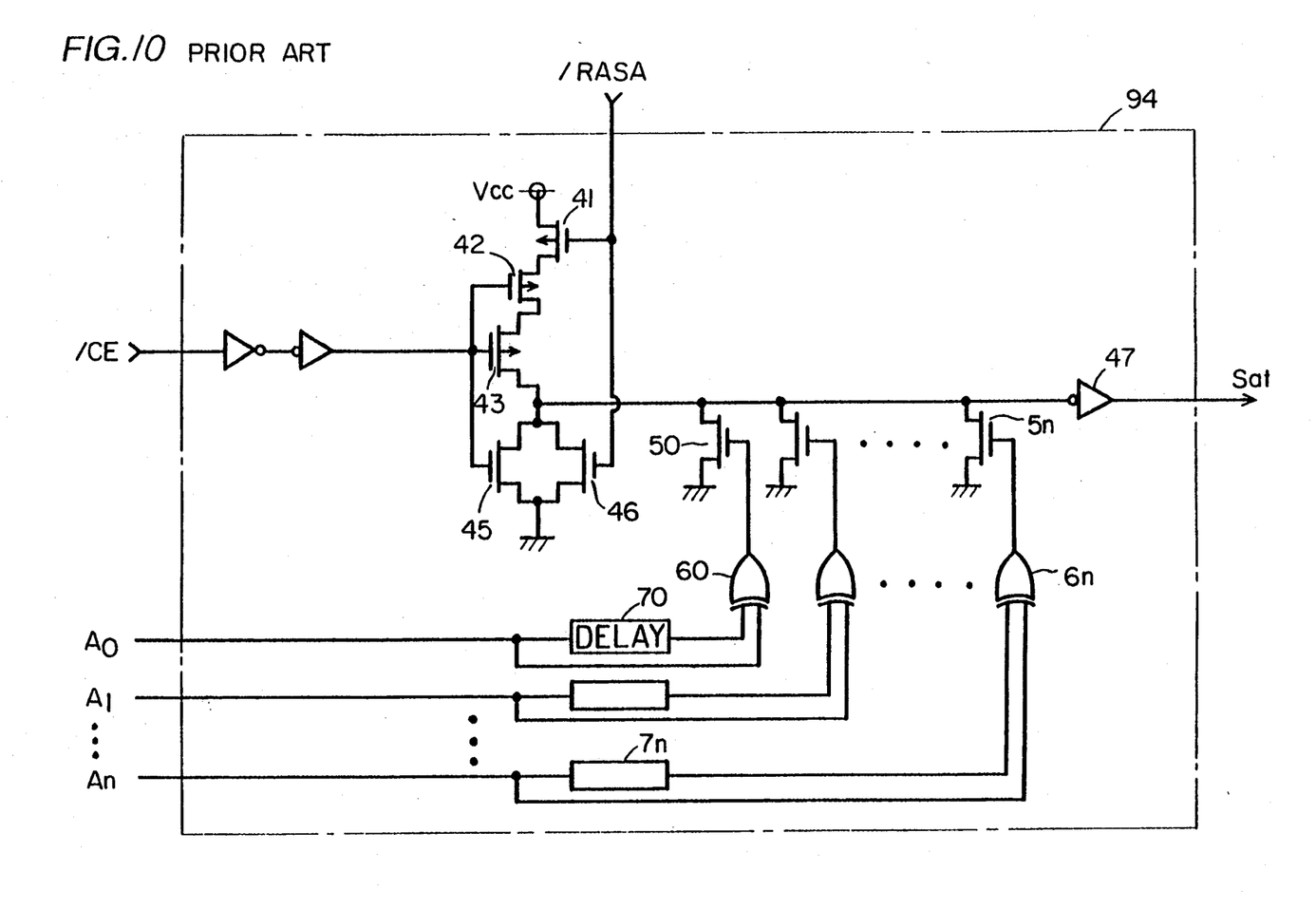
FIG. 10 is a schematic diagram of the ATD circuit shown in FIG. 5.

FIG. 10 is a schematic diagram of ATD circuit 94 shown in FIG. 5. Referring to FIG. 10, ATD circuit 94 includes PMOS transistors 41 to 43, NMOS transistors 45, 46, 50 to 5n, inverters 47, EXOR gates 60 to 6n, and delay elements 70 to 7n. In operation, since the internal row address strobe signal /RASA of a low level is first applied, transistor 41 is turned on. In addition to this, since the column system enable signal /CE of a low level is applied, transistors 42, 43 are turned on. ATD circuit 94 is activated by conduction of transistors 41, 42 and 43, and inverter 47 provides the output signal Sat of a low level.

When address signals A0 to An are changed, a corresponding one of EXOR gates 60 to 6n generates a short pulse. Therefore, since a corresponding one of transistors 50 to 5n is rendered conductive, the output signal Sat attains a high level during the applied pulse width. As a result, the ATD pulse AP is provided as the output signal Sat.

Application of the column system enable signal /CE of a high level causes conduction of transistor 45, whereby ATD circuit 94 provides the output signal Sat of a high level. Therefore, ATD circuit 94 continues to provide the output signal Sat of a high level in the period of non-activation, without operating in response to change of address signals A0 to An.

As described above, the termination signal SOD is caused to rise a predetermined time after activation of a word line signal. However, the transmission speed of the termination signal SOD on a semiconductor substrate differs depending on individual devices, that is, individual DRAMs. More specifically, although circuits necessary for the DRAM are formed on the semiconductor substrate, because of variations of manufacturing parameters in manufacturing steps (for example, accuracy, ambient temperature and the like), a rising timing of the termination signal SOD is hastened or delayed. In other words, the time tse shown in FIG. 8 varies for each device. This causes the following problem.

Ideally, ATD circuit 94 needs to detect transition of the address signal immediately after being activated to generate the desired ATD pulse AP. However, immediately after being activated, ATD circuit 94 sometimes operates unstably in a short time to produce a bad effect in DRAM 200. Therefore, when testing individual DRAMs before shipping, it is necessary to determine whether or not normal reading and writing operations can be carried out, even if ATD circuit 94 operates unstably in a short time immediately after ATD circuit 94 is activated. When normal reading and writing operations cannot be carried out, the DRAM is discarded as a defective product. The test is carried out by writing test data into the DRAM, and detecting reading out of desired data.

Therefore, in order to carry out the above-described test, it is necessary to change address signals A0 to An immediately after the fall of the output signal Sat of ATD circuit 94. However, as described above, variation of the rising timing of the termination signal SOD causes change of the falling timing of the signal Sat. As a result, at a desired timing, in other words, at a timing immediately after the signal Sat falls, it is difficult to change address signals A0 to An.

Therefore, the conventional tests have been conducted by changing address signals A0 to An at various timings t11 to t17 within a predetermined period T2 shown in FIG. 8, and by repeating data writing and data reading for each transition timing. Since a desired timing for test (that is, a timing immediately after activation of ATD circuit 94) t13 is included in the transition timings t11 to t17, it is determined whether or not the tested DRAM is suitable for shipping by ensuring that desired data can be read out at all the timings t11 to t17. If the written data is not read out in any of the timings t11 to t17, the tested DRAM is discarded as a defective product.

As described above, in order to conduct the test to the conventional DRAM, it was necessary to carry out data reading and data writing for a plurality of timings t11 to t17, whereby the time required for carrying out the test was increased.

SUMMARY OF THE INVENTION

One object of the present invention is to shorten time required for testing a semiconductor memory device including an address transition detector.

Another object of the present invention is to shorten time required for testing a dynamic random access memory including an address transition detector.

Still another object of the present invention is to shorten time required for testing a circuit connected to an output of an address transition detector.

Briefly, the semiconductor memory device according to the present invention includes a memory cell array including a plurality of memory cells arranged in rows and columns, a sense amplifier for amplifying data signals stored in the memory cells, a circuit for generating a sense termination signal indicating termination of a sense operation by the sense amplifier, an address transition detector for detecting transition of an externally applied address signal, an activating circuit for activating the address transition detector in response to the sense termination signal, and a timing control circuit for controlling an activation timing by the activating circuit in response to an externally applied timing control signal.

In operation, the timing control circuit controls the activation timing by the activating circuit in response to the externally applied timing control signal. Therefore, since it is possible to externally determine the activation timing of the address transition detector and the transition timing of the address signal individually, it is possible to shorten the time period for changing the address signal repeatedly at different timings in a test. Therefore, time required for the test can be shortened.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
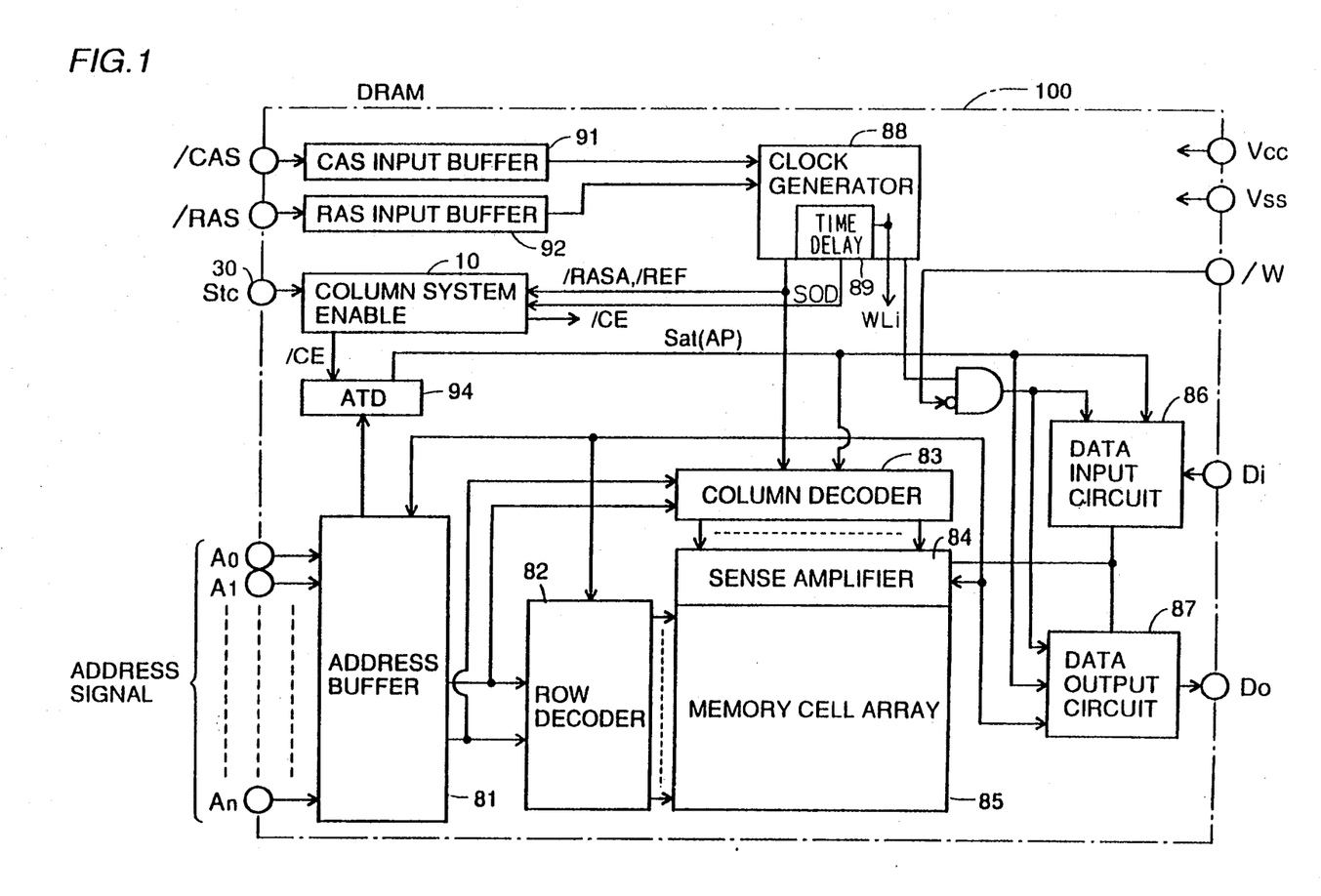
FIG. 1 is a block diagram of a DRAM showing one embodiment of the present invention.

Referring to FIG. 1, a DRAM 100 includes an improved column system enable circuit 10. Column system enable circuit 10 receives an externally applied timing control signal Stc through a newly provided external terminal 30.

Figure 2:
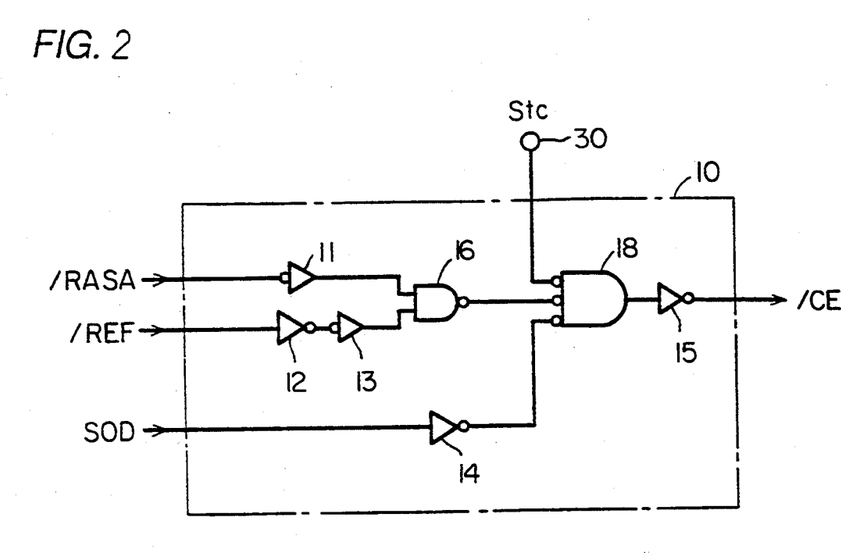
FIG. 2 is a schematic diagram of the column system enable circuit shown in FIG. 1.

FIG. 2 is a schematic diagram of column system enable circuit 10 shown in FIG. 1. Referring to FIG. 2, column system enable circuit 10, compared to a circuit 20 shown in FIG. 3, includes a NOR gate 18 having three input nodes in place of a NOR gate 17 having two input nodes. The third input node of NOR gate 18 is connected to external terminal 30. The timing control signal Stc is applied through terminal 30.

Figure 4:
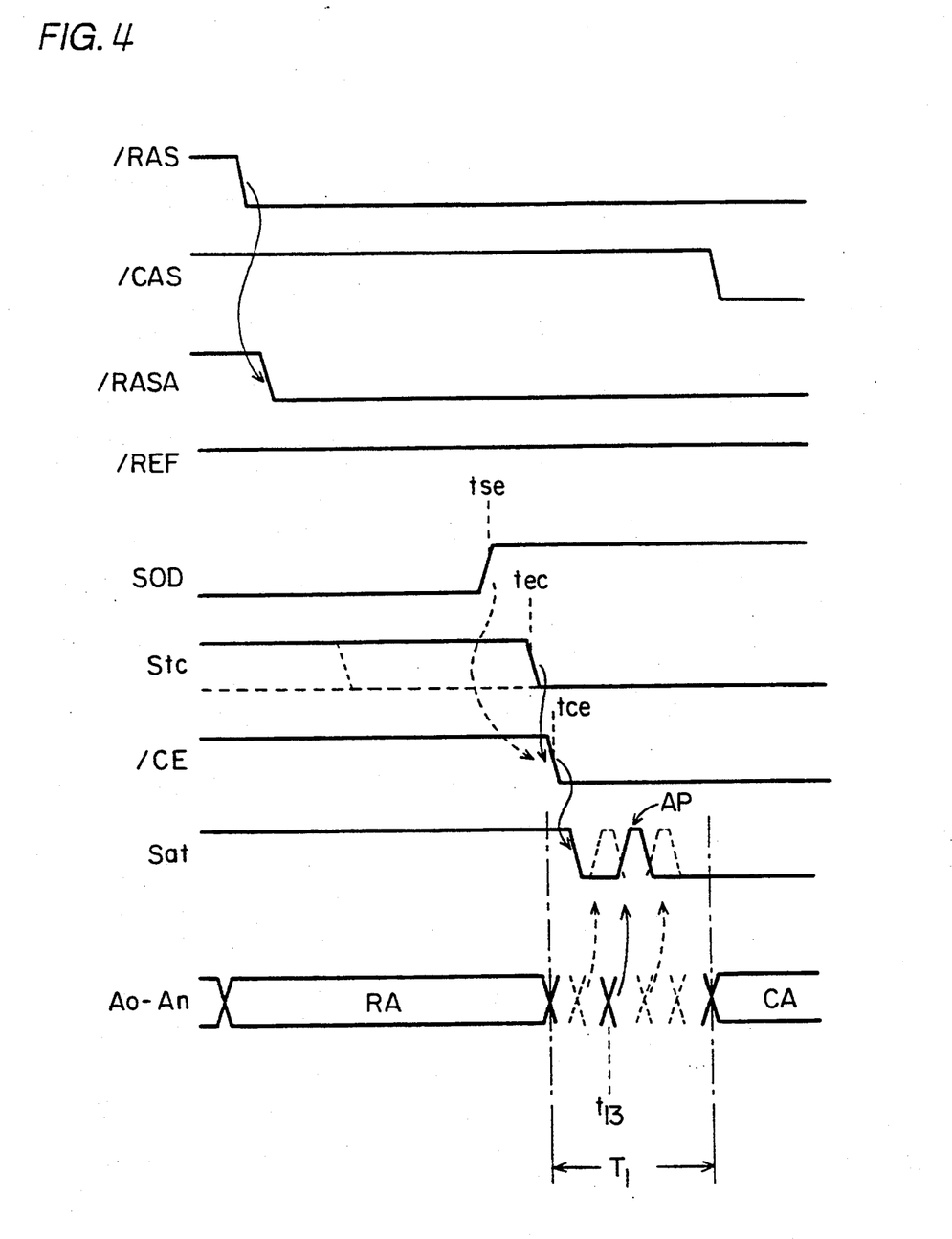
FIG. 4 is a timing chart for explaining operations of the circuit shown in FIG. 2.

FIG. 4 is a timing chart for explaining operations of column system enable circuit 10 shown in FIG. 2. Referring to FIGS. 2 and 4, operations of column system enable circuit 10 will now be described.

In response to the fall of a signal /RAS, an internal signal /RASA falls. A signal /REF of a high level is applied from a clock generator 88. Therefore, a NAND gate 16 applies an output signal of a low level to NOR gate 18 in response to the signal /RASA of a low level and the signal /REF of a high level. Since a signal of a high level is applied from an inverter 14 to NOR gate 18 before the rise of a termination signal SOD, NOR gate 18 provides a signal of a low level. Therefore, a column system enable signal /CE of a high level is provided through inverter 15.

At a time tse, the termination signal SOD rises. The rising timing tse may be varied by various conditions for each device as described above. After the signal SOD rises, a signal of a low level is applied from inverter 14 to NOR gate 18. However, since NOR gate 18 receives the timing control signal Stc of a high level until an externally designated time tec, it continues to provide a signal of a low level. Therefore, until the time tec, the column system enable signal /CE of a high level is provided through inverter 15.

At the time tec, the externally applied timing control signal Stc falls. In response to the fall of the signal Stc, an output signal of NOR gate 18 rises. Therefore, after the time tce, the column system enable signal /CE of a low level is provided through inverter 15. An ATD circuit 94 shown in FIG. 1 is activated in response to the signal /CE of a low level.

As soon as ATD 94 is activated, the output signal Sat of ATD 94 falls. Therefore, since the falling timing of the signal Sat is approximately determined by the falling timing tec of the externally applied timing control signal Stc, it is possible to know precisely the timing at which address signals A0 to An should be changed in a test. More specifically, although it is necessary to change address signals A0 to An immediately after ATD 94 is activated in the test, the falling timing tec of the external timing control signal Stc is known, whereby it is possible to determine easily the address transition timing t13 to be tested. Therefore, unlike the case in the period T2 shown in FIG. 8, it is not necessary to change address signals A0 to An many times repeatedly. As a result, in the period T1 shown in FIG. 4, as compared to the period T2 shown in FIG. 8, since repetition of transition of address signals A0 to An only a small number of times is sufficient, it is possible to shorten time required for the test.

The ATD pulse AP included in the address transition detect signal Sat is applied to column decoder 83, data input circuit 86 and data output circuit 87 shown in FIG. 1. These circuits 83, 86 and 87 are activated in response to the ATD pulse AP. In the test, at the time tec shown in FIG. 4, the externally applied timing control signal Stc is caused to fall. In addition to this, at the time t13, externally applied address signals A0 to An are changed from the row address RA to the column address CA. Therefore, after the time t13, the ATD pulse AP is generated from ATD circuit 94, causing the circuits 83, 86 and 87 to be activated in response to the pulse AP. In the test, "normal" of the DRAM is determined by ensuring that desired data is read out after writing data in the test.

Although the external timing control signal Stc is caused to fall at the time tec in the test, the signal Stc is changed to a low level at least before the time tse (shown by a broken line in FIG. 4) in the normal operation, that is, when operations excluding the test operation are carried out. Sometimes, by grounding external terminal 30, the signal Stc of a low level continues to be applied. By applying the signal Stc of a low level before the time tse, column system enable circuit 10 shown in FIG. 2 operates similarly to circuit 20 shown in FIG. 3.

In the above-described embodiment, external terminal 30 is newly provided, through which the external timing control signal Stc is applied. In other preferred embodiments, an internal signal changing at a timing similar to that of the signal Stc shown in FIG. 4 can be used in place of the externally applied signal Stc. Sometimes, a circuit for generating an internal signal changing at the same timing as that of the signal Stc is provided.

As described above, in DRAM 100 shown in FIG. 1, the activation timing of ATD 94 is determined by the falling timing tec of the externally applied timing control signal Stc. Therefore, immediately after activation of ATD 94, it is possible to change address signals A0 to An at the most suitable timing t13 to be tested. Therefore, since the number of address transition timings to be tested in the period T1 shown in FIG. 4 can be reduced, it is possible to shorten time required for the test.

Although the above description was given to the example where the present invention is applied to the DRAM, it is pointed out that the present invention can be widely applied to semiconductor memories including an address transition detector (ATD) in general.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array including a plurality of memory cells arranged in rows and columns;
   sense amplifier means for amplifying data signals stored in said memory cells;
   means for generating a termination signal indicating a predetermined end of a sense operation by said sense amplifier means;
   address transition detector means for detecting transition of an externally applied address signal;
   activating means responsive to the termination signal for activating said address transition detector means; and
   timing control means responsive to an externally applied timing control signal for delaying an activation timing by said activating means of said address transition detector means later than a timing defined by said termination signal.

2. The semiconductor memory device according to claim 1, further comprising internal circuit means responsive to an output signal from said address transition detector means for carrying out a predetermined operation.

3. The semiconductor memory device according to claim 2, wherein
   said internal circuit means is activated in response to an address transition detect pulse generated from said address transition detector means, and carries out said predetermined operation.

4. The semiconductor memory device according to claim 1, wherein
   said activating means includes logical sum circuit means having first and second input nodes, and
   said logical sum circuit means has the first input node connected to receive said termination signal, and the second input node connected to receive said externally applied timing control signal through said timing control means.

5. The semiconductor memory device according to claim 4, wherein
   said timing control means includes an external terminal connected to the second input node of said logical sum circuit means for receiving said externally applied timing control signal.

6. The semiconductor memory device according to claim 2, wherein
   said internal circuit means includes output amplifier means responsive to an output signal from said address transition detector means for amplifying a signal amplified by said sense amplifier means for data output.

7. The semiconductor memory device according to claim 1, wherein
   said termination signal generating means generates said termination signal by delaying the activation timing of a word line signal.

8. The semiconductor memory device according to claim 1, wherein
   said semiconductor memory device is a dynamic random access memory.

* * * * *